(12) United States Patent
Terayama

(10) Patent No.: US 8,367,283 B2
(45) Date of Patent: Feb. 5, 2013

(54) POSITIVE PHOTOSENSITIVE RESIN COMPOSITION, CURED FILM, PROTECTING FILM, INSULATING FILM AND SEMICONDUCTOR AND DISPLAY DEVICES USING THE SAME

(75) Inventor: Miki Terayama, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 199 days.

(21) Appl. No.: 13/054,889

(22) PCT Filed: Jul. 16, 2009

(86) PCT No.: PCT/JP2009/062894
§ 371 (c)(1),
(2), (4) Date: Jan. 19, 2011

(87) PCT Pub. No.: WO2010/010842
PCT Pub. Date: Jan. 28, 2010

(65) Prior Publication Data
US 2011/0159432 A1    Jun. 30, 2011

(30) Foreign Application Priority Data

Jul. 22, 2008  (JP) ................................ 2008-188277

(51) Int. Cl.
*G03F 7/023* (2006.01)
(52) U.S. Cl. ........... 430/18; 430/165; 430/192; 430/193
(58) Field of Classification Search .................. 430/18, 430/165, 192, 193
See application file for complete search history.

(56) References Cited

U.S. PATENT DOCUMENTS

| 4,927,736 A | 5/1990 | Mueller et al. |
| 6,177,225 B1 * | 1/2001 | Weber et al. ................... 430/190 |
| 6,939,659 B2 * | 9/2005 | Naiini et al. ................... 430/190 |
| 7,101,652 B2 * | 9/2006 | Naiini et al. ................... 430/190 |
| 7,368,216 B2 * | 5/2008 | Sato et al. ..................... 430/191 |
| 2010/0044888 A1 | 2/2010 | Terakawa |

FOREIGN PATENT DOCUMENTS

| EP | 1 707 588 A1 | 10/2006 |
| JP | 64-60630 A | 3/1989 |
| JP | 2004-125814 A | 4/2004 |
| JP | 2008-156614 A | 7/2008 |
| WO | WO 2008/050886 A1 | 5/2008 |

OTHER PUBLICATIONS

International Search Report PCT/JP2009/062894 issued Aug. 11, 2009.
European Search Report issued Nov. 22, 2011, in European Patent Application No. 09800356.9.

* cited by examiner

*Primary Examiner* — John Chu
(74) *Attorney, Agent, or Firm* — Birch, Stewart, Kolasch & Birch, LLP

(57) ABSTRACT

The positive photosensitive resin composition of the present invention has a polyamide resin and a photosensitive agent, wherein the polyamide resin has a specific structure. The cured film of the present invention has a cured product of the positive photosensitive resin composition. The protecting film and insulating film of the present invention has the cured film each. The semiconductor device and display device of the present invention has the cured film each.

12 Claims, No Drawings

POSITIVE PHOTOSENSITIVE RESIN COMPOSITION, CURED FILM, PROTECTING FILM, INSULATING FILM AND SEMICONDUCTOR AND DISPLAY DEVICES USING THE SAME

TECHNICAL FIELD

The present invention relates to a positive photosensitive resin composition, a cured film, a protecting film, an insulating film and semiconductor and display devices using the same.

BACKGROUND ART

Polyimide resin, which has excellent heat resistance and outstanding electrical and mechanical properties, has been used for the protecting film and insulating film of a semiconductor device. Recently, however, polybenzoxazole resin has begun to be used in state-of-the-art semiconductor devices, which has no highly polar carbonyl group derived from imide ring and thus has excellent moisture resistance reliability. Furthermore, there has been developed a photosensitive resin composition which is obtained by imparting photosensitivity to a polybenzoxazole or polyimide resin so that it is able to simplify a part of the pattern forming process and thus is effective in shortening the process and increasing yield.

Recently, there has been developed a positive photosensitive resin composition which comprises a polybenzoxazole precursor which was improved in view of safety so that it can be developed in alkaline aqueous solutions, and a diazoquinone compound as a photosensitive agent (for example, see Patent Literature 1).

Hereinafter, the production of a relief pattern with a positive photosensitive resin composition and its developing mechanism will be described. First, a coating of a positive photosensitive resin composition is formed on a substrate. The coating is exposed to actinic radiation through a mask by means of an exposure apparatus called stepper, thereby forming a portion that was exposed (hereinafter referred to as "exposed portion") and a portion that was not exposed (hereinafter referred to as "unexposed portion"). The diazoquinone compound present in the unexposed portion is insoluble in alkaline aqueous solutions, and it is provided with resistance to alkaline aqueous solutions by the interaction with the resin. On the other hand, the diazoquinone compound present in the exposed portion causes chemical change by the action of the actinic radiation to produce carboxylic acid. As a result, the exposed portion is soluble in alkaline aqueous solutions and promotes dissolution of the resin. It is able to produce a relief pattern comprising the unexposed portion only, by dissolving and removing the exposed portion using the difference in solubility between the exposed and unexposed portions.

Conventionally, the polybenzoxazole precursor resin which is contained in a positive photosensitive resin composition forming a coating pattern, is finally cured at a high temperature of near 300° C. for dehydration and ring-closure reaction, thereby obtaining a polybenzoxazole resin with excellent heat resistance. Meanwhile, as a result of the downsizing and integration of semiconductor devices in recent years, the heat resistance of, especially, memory elements is lower than before. Accordingly, to increase yield, a polybenzoxazole precursor resin which can be cured at a lower temperature is necessary. When using such photosensitive resin compositions, their sensitivity is very important. In the case of low sensitivity, that is, when the sensitivity is poor, it takes a longer exposure time and result in a decrease in throughput.

As just described, recently, there is a strong need for the development of a photosensitive resin composition which has high sensitivity and which is highly heat resistant and reliable even when it is cured at a low temperature.

When a photosensitive resin composition is used to form a semiconductor device or display device, generally, an edge bead rinse (EBR) process is employed to wash and remove a film of unnecessary photosensitive resin composition with a solvent, the film being formed at the edge of a substrate after coating.

CITATION LIST

Patent Literature 1: Japanese Patent Application Laid-Open No. 2004-125814

SUMMARY OF INVENTION

Technical Problem

An object of the present invention is to provide a positive photosensitive resin composition which has high sensitivity and which is highly heat resistant and reliable even when it is cured at a low temperature.

Another object of the present invention is to provide a cured film which has high sensitivity and which is highly heat resistant and reliable even when it is cured at a low temperature, a protecting film, an insulating film and semiconductor and display devices using the same.

Solution to Problem

These objects were achieved by the present invention according to the following [1] to [12].

[1] A positive photosensitive resin composition comprising a polyamide resin and a photosensitive agent, wherein the polyamide resin is represented by the formula (1):

[Chemical Formula 1]

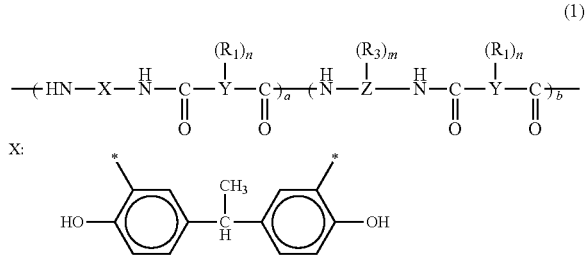

wherein Y is an organic group; Z is an organic group; $R_1$ is a hydroxyl group, carboxyl group, O—$R_2$ or COO—$R_2$; n is an integer of 0 to 4 and when n is an integer of 2 or more, two or more $R_1$s may be the same or different; $R_2$ is an organic group having 1 to 15 carbon atoms; $R_3$ is a hydroxyl group or O—$R_2$; m is an integer of 0 to 2 and when m is 2, two $R_3$s may be the same or different; a is 30 to 70 mol %; b is 30 to 70 mol %; a+b=100 mol %; when $R_3$ is a hydroxyl group, it is attached to an ortho position of the amide group, and when $R_3$ is not a hydroxyl group, at least one $R_1$ is a carboxyl group; and * means connecting to the NH group.

[2] The positive photosensitive resin composition according to [1], wherein Z of the polyamide resin is represented by the formula (2-1):

[Chemical Formula 2]

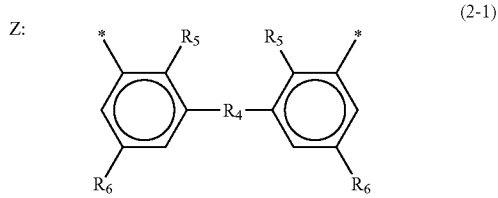

(2-1)

wherein * means connecting to the NH group; $R_4$ is an organic group; $R_5$ is a hydrogen atom, alkyl group, alkoxy group, acyloxy group or cycloalkyl group and $R_5$s may be the same or different; $R_6$ is a hydrogen atom, alkyl group, alkoxy group, acyloxy group or cycloalkyl group and $R_6$s may be the same or different; and $R_3$ is omitted herein.

[3] The positive photosensitive resin composition according to [1], wherein Z of the polyamide resin is represented by the formula (2-2):

[Chemical Formula 3]

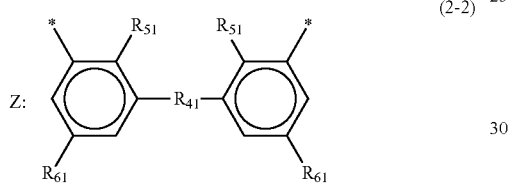

(2-2)

wherein means connecting to the NH group; $R_{41}$ is an organic group; $R_{51}$ is an alkyl group, alkoxy group, acyloxy group or cycloalkyl group and $R_{51}$s may be the same or different; $R_{61}$ is an alkyl group, alkoxy group, acyloxy group or cycloalkyl group and $R_{61}$s may be the same or different; and $R_3$ is omitted herein.

[4] The positive photosensitive resin composition according to any of [1] to [3], wherein Y of the polyamide resin is selected from the group consisting of the formulae (3-1) to (3-3):

[Chemical Formula 4]

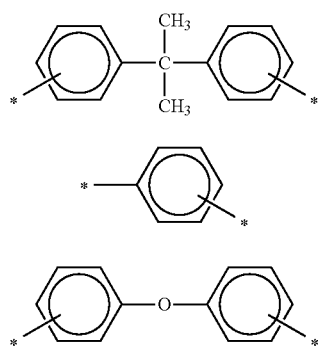

(3-1)

(3-2)

(3-3)

wherein * means connecting to the C=O group.

[5] The positive photosensitive resin composition according to any of [1] to [4], wherein the polyamide resin has a transmittance of 20% or more at a wavelength of 365 nm.

[6] The positive photosensitive resin composition according to any of [1] to [5], wherein the polyamide resin shows a cyclization rate of 80% or more after it is cured by heating at 250° C. for 90 minutes.

[7] The positive photosensitive resin composition according to any of [1] to [6], wherein the photosensitive agent is one or more kinds of photosensitive diazoquinone compounds having a structure selected from the group consisting of the formulae (6-1) to (6-9):

[Chemical Formula 5]

[Formula (6)]

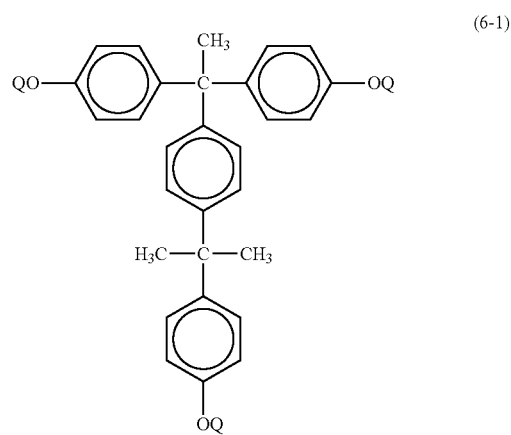

(6-1)

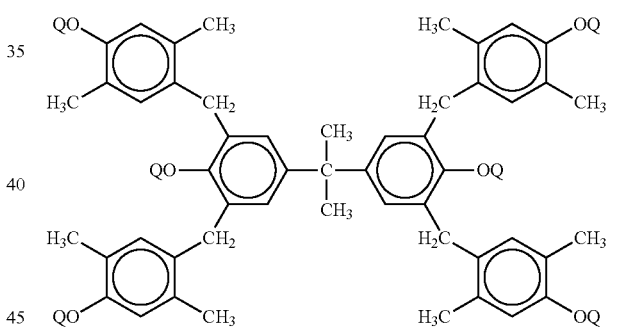

(6-2)

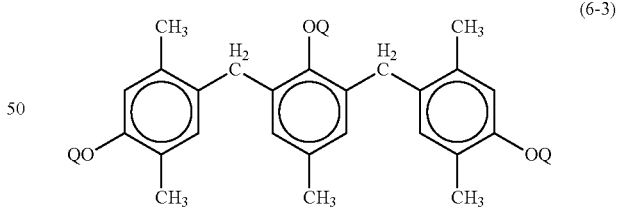

(6-3)

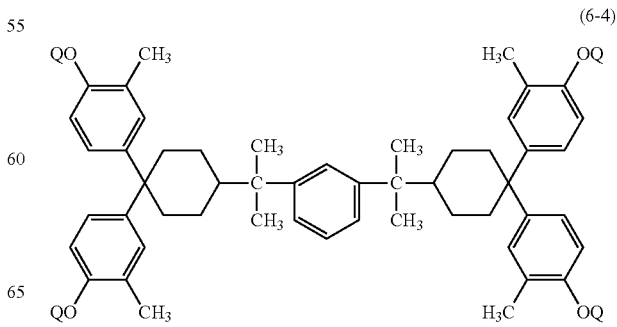

(6-4)

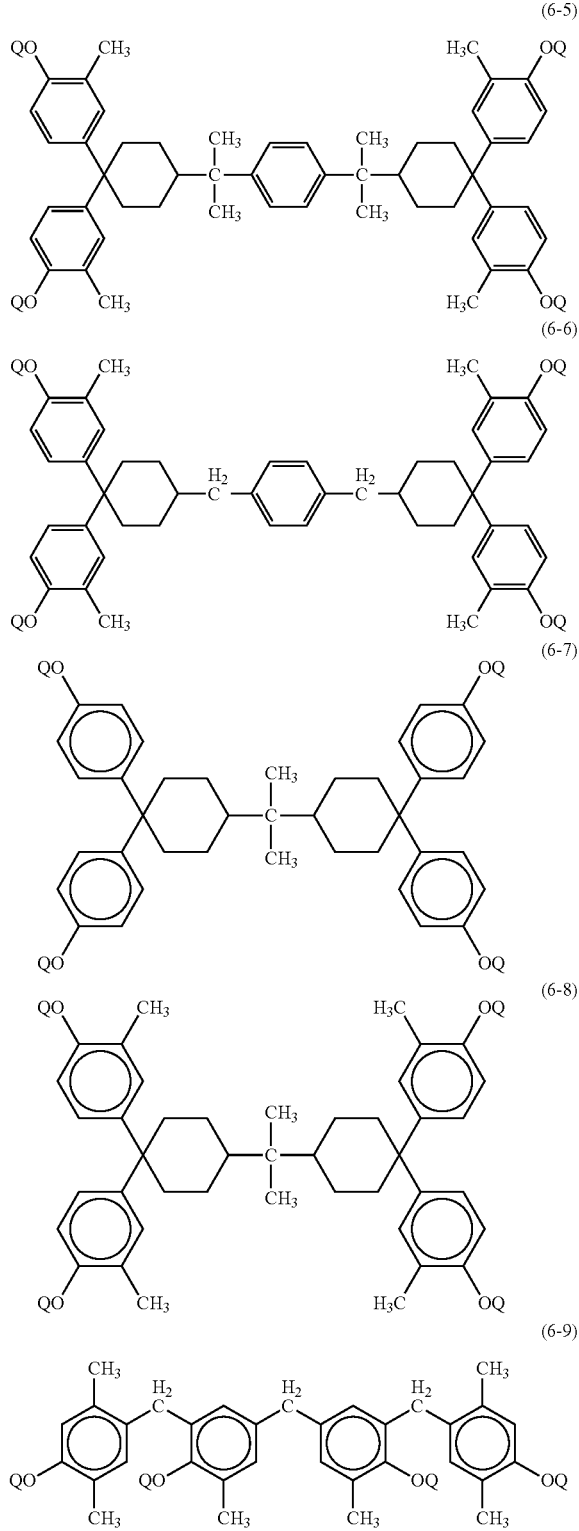

(6-5)
(6-6)
(6-7)
(6-8)
(6-9)

[8] A cured film comprising a cured product of the positive photosensitive resin composition defined by any of [1] to [7].

[9] A protecting film comprising the cured film defined by [8].

[10] An insulating film comprising the cured film defined by [8].

[11] A semiconductor device comprising the cured film defined by [8].

[12] A display device comprising the cured film defined by [8].

Advantageous Effects of Invention

According to the present invention, it is able to obtain a positive photosensitive resin composition which has high sensitivity, which is highly heat resistant and reliable even when it is cured at a low temperature, and which can use wide variety of organic solvents in EBR process. It is also able to obtain a cured film, a protecting film, an insulating film and semiconductor and display devices using the same.

DESCRIPTION OF EMBODIMENTS

Hereinafter, a positive photosensitive resin composition of the present invention, a cured film, a protecting film, an insulating film and semiconductor and display device using the same, will be described.

(1) Positive Photosensitive Resin Composition

The positive photosensitive resin composition of the present invention comprises a polyamide resin and a photosensitive agent, wherein the polyamide resin is represented by the formula (1):

[Chemical Formula 6]

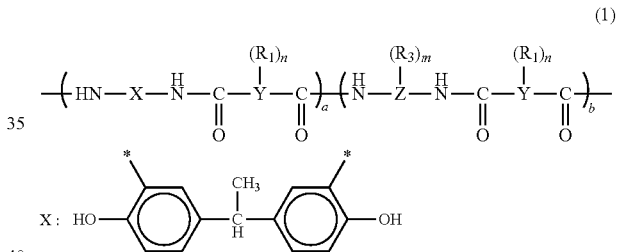

(1)

wherein Y is an organic group; Z is an organic group; $R_1$ is a hydroxyl group, carboxyl group, O—$R_2$ or COO—$R_2$; n is an integer of 0 to 4 and when n is an integer of 2 or more, two or more $R_1$s may be the same or different; $R_2$ is an organic group having 1 to 15 carbon atoms; $R_3$ is a hydroxyl group or O—$R_2$; m is an integer of 0 to 2 and when m is 2, two $R_3$s may be the same or different; a is 30 to 70 mol %; b is 30 to 70 mol %; a+b=100 mol %; when $R_3$ is a hydroxyl group, it is attached to an ortho position of the amide group, and when $R_3$ is not a hydroxyl group, at least one $R_1$ is a carboxyl group; and * means connecting to the NH group.

Components of the positive photosensitive resin composition of the present invention will be described in detail.

First, the polyamide resin represented by the formula (1) will be described in detail.

The polyamide resin has a main chain skeleton having a polyamide structure. The main chain skeleton or a side chain thereof has at least a hydroxyl group and may have a carboxyl group, ether group or ester group. When cured by heating, the resin causes a cyclization reaction by the action of the hydroxyl group, carboxyl group, ether group or ester group, the reaction involving elimination of small molecules, thereby becoming a cured product which has a main chain skeleton having a cyclic structure. Also, this polymer has a hydroxyl group that is necessary to show alkali solubility, and sometimes a carboxyl group.

The polyamide resin is a polymer which always has a polybenzoxazole precursor structure due to the repeating unit including organic group X, and may also have one or more of polyimide precursor structures and polyamic ester structures (structures in which an acid portion of the polyamic acid is esterified).

The polyamide resin represented by the formula (1) is obtained by the reaction of, for example, a bis(aminophenol) containing organic group X, a compound selected from the group consisting of a diamine, bis(aminophenol), 2,4-diaminophenol and so on, all of which containing organic group Z, with a compound selected from the group consisting of a tetracarboxylic dianhydride, trimellitic anhydride, dicarboxylic acid, dicarboxylic acid dichloride, dicarboxylic acid derivative, hydroxydicarboxylic acid, hydroxydicarboxylic acid derivative and so on, all of which containing organic group Y.

The polyamide resin represented by the formula (1) has excellent transparency and shows a high cyclization rate when cured at a low temperature. Therefore, the positive photosensitive resin composition comprising this polyamide resin has high sensitivity and it is highly heat resistant and reliable when cured at a low temperature. In addition, said polyamide resin is highly soluble in organic solvents, so that the positive photosensitive resin composition comprising said polyamide resin can use a wide variety of organic solvents in EBR process.

The reason why the use of the polyamide resin increases the sensitivity of the positive photosensitive resin composition and the heat resistance and reliability of the same when it is cured at a low temperature, is considered as follows. X in the polyamide resin is characterized by having a structure in which two aromatic rings are connected through an ethylidene. That is, the conjugation of the two aromatic rings is disconnected by the ethylidene. As a result, the ultraviolet transmittance of the polyamide resin is increased, thereby light that is necessary for patterning reaches deep into the coating in the exposed portion; therefore, there is an increase in the sensitivity. Furthermore, the ethylidene has a small steric structure, and it is present in the main chain of the polyamide resin; therefore, it is considered that the molecular chain is likely to move and the cyclization ability of the polyamide resin is increased even when the polyamide resin is cured at a low temperature. As a result, it is considered that there is an increase in the sensitivity of the positive photosensitive resin composition comprising the polyamide resin and the heat resistance and reliability of the same when it is cured at a low temperature.

The ethylidene has an aliphatic structure which is small but branched. Accordingly, compared to the case where the two aromatic rings are connected by a methylene or single bond, it is considered to have higher solubility in organic solvents. Furthermore, X in the polyamide resin is characterized by the following: of two ortho positions of the amide bond, a hydroxyl group is attached to one ortho position, while a hydrogen is attached to the other ortho position and there is no substituent at the other ortho position. Therefore, it is considered that the polarity of the polymer is not decreased too much, and the polymer is soluble in organic solvents used in EBR process.

Z of the polyamide resin is an organic group. In the present invention, "organic group" means a hydrocarbon structure that can contain a heteroatom other than a carbon atom; $R_3$ is a hydroxyl group or O—$R_2$; $R_2$ is an organic group having 1 to 15 carbon atoms; m is an integer of 0 to 2 and when m is 2, two $R_3$s may be the same or different; and two or more kinds of Zs can be contained in the polyamide resin.

Examples of organic group Z include aromatic compounds such as benzene ring and naphthalene ring, heterocyclic compounds such as bisphenols, pyrroles and furanes, and siloxane compounds. In particular, preferred is one represented by the formula (2-1):

[Chemical Formula 7]

Z:

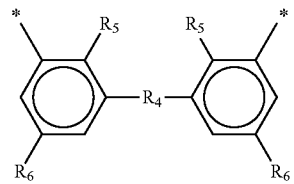

(2-1)

wherein * means connecting to the NH group; $R_4$ is an organic group; $R_5$ is a hydrogen atom, alkyl group, alkoxy group, acyloxy group or cycloalkyl group and $R_5$s may be the same or different; $R_6$ is a hydrogen atom, alkyl group, alkoxy group, acyloxy group or cycloalkyl group and $R_6$s may be the same or different; and $R_3$ is omitted herein.

Specific examples of organic group $R_4$ of the formula (2-1) include a single bond, alkylene, substituted alkylene, —O—, —S—, —SO$_2$—, —Si(CH$_3$)$_2$—, —C$_6$H$_4$—, —CO—, —NHCO—, —COO— and —C(CF$_3$)$_2$—. When $R_5$ and $R_6$ are a hydrogen atom each, $R_4$ has no —CH(CH$_3$)— structure.

When $R_4$ of the formula (2-1) is an alkylene or substituted alkylene, it is preferably one having 1 to 8 carbon atoms, and particularly preferably one having 1 to 3 carbon atoms. More specifically, there may be mentioned —CH$_2$—, —CH(CH$_2$)—, —C(CH$_3$)$_2$—, etc. A polyamide resin is obtained therefore, which has excellent transparency, is heat resistant and reliable even when it is cured at a low temperature, and has a better balance of them. When $R_5$ and $R_6$ are an alkyl or alkoxy group, particularly preferred is one having 1 to carbon atoms. When $R_5$ and $R_6$ are an acyloxy group, particularly preferred is one having 2 to 8 carbon atoms. When $R_5$ and $R_6$ are a cycloalkyl group, preferred is one having 5 to 8 carbon atoms.

Z of the polyamide resin is preferably one represented by the formula (2-2). A polyamide resin is obtained therefore, which has more excellent transparency and is more heat resistant and reliable even when it is cured at a low temperature.

[Chemical Formula 3]

Z:

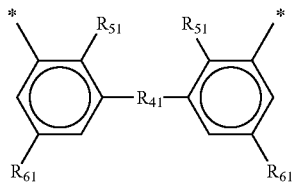

(2-2)

wherein * means connecting to the NH group; $R_{41}$ is an organic group; $R_{51}$ is an alkyl group, alkoxy group, acyloxy group or cycloalkyl group and $R_{51}$s may be the same or different; $R_{61}$ is an alkyl group, alkoxy group, acyloxy group or cycloalkyl group and $R_{61}$s may be the same or different; and $R_3$ is omitted herein.

The reason why the use of one represented by the formula (2-2) as Z of the formula (1) increases the transparency further is considered as follows. Due to the steric structure of the substituents shown as $R_{51}$ in the formula (2-2), the aromatic rings connected through $R_{41}$ are bent and thus have difficulty in having a planar structure, so that charge transfer is unlikely to occur. The reason why there is an increase in the heat resistance and reliability even when it is cured at a low temperature, is considered as follows. The amide bond in the polyamide resin is pushed to the hydroxyl group side due to steric hindrance with substituent $R_{51}$ in the ortho position, so that a cyclization reaction is likely to occur and thus the polyamide resin shows a high cyclization rate even when it is cured at a low temperature. Specific example of organic group $R_{41}$ of the formula (2-2) include a single bond, alkylene, substituted alkylene, —O—, —S—, —SO$_2$—, —Si(CH$_3$)$_2$—, —C$_6$H$_4$—, —CO—, —NHCO—, —COO— and —C(CF$_3$)$_2$—.

When $R_{41}$ of the formula (2-2) is an alkylene or substituted alkylene, it is preferably one having 1 to 8 carbon atoms, and particularly preferably one having 1 to 3 carbon atoms. More specifically, there may be etc. A mentioned —CH$_2$—, —CH(CH$_3$)—, —C(CH$_3$)$_2$—, etc. A polyamide resin is obtained therefore, which has excellent transparency, is heat resistant and reliable even when it is cured at a low temperature, and has a better balance of them. When $R_{51}$ and $R_{61}$ are an alkyl or alkoxy group, particularly preferred is one having 1 to 8 carbon atoms. When $R_{51}$ and $R_{61}$ are an acyloxy group, particularly preferred is one having 2 to 8 carbon atoms. When $R_{51}$ and $R_{61}$ are a cycloalkyl group, preferred is one having 5 to 8 carbon atoms.

In $R_5$ and $R_6$ of the formula (2-1) or $R_{51}$ and $R_{61}$ of the formula (2-2), specific examples of the alkyl group include —CH$_3$, —CH$_2$CH$_3$, —CH$_2$CH$_2$CH$_3$, —CH(CH$_3$)$_2$, —CH$_2$CH$_2$CH$_2$CH$_3$ and —CH$_2$CH(CH$_3$)$_2$. Specific examples of the alkoxy group include —OCH$_3$, —OCH$_2$CH$_3$, —OCH$_2$CH$_2$CH$_3$, —OCH(CH$_3$)$_2$, —OCH$_2$CH$_2$CH$_2$CH$_3$, —OCH$_2$CH(CH$_3$)$_2$, —OCH(CH$_3$)(CH$_2$CH$_3$) and —OC(CH$_3$)$_3$.

Y of the polyamide resin represented by the formula (1) is an organic group. $R_1$ is a hydroxyl group, carboxyl group, O—$R_2$ or COO—$R_2$. $R_2$ is an organic group having 1 to 15 carbon atoms, and n is an integer of 0 to 4. When n is an integer of 2 or more, two or more $R_1$s may be the same or different. In the case where the repeating unit of which mol % is represented by a is repeating unit A and the repeating unit of which mol % is represented by b is repeating unit B, Y in repeating unit A and in repeating unit B may be the same or different. In each of repeating units A and B, two or more kinds of Ys may be contained.

As Y of the polyamide resin represented by the formula (1), for example, there may be used an ester compound selected from the group consisting formulae (4) and (5) described in paragraphs [0018] and [0019] of Japanese Patent Application Laid-Open (JP-A) No. 2008-170498. They can be used alone or in combination of two or more kinds.

Particularly suitable as Y are those represented by the following formulae (3-1) to (3-3). Y is preferably one or more kinds selected from the group consisting of the formulae (3-1) to (3-3), so that the polyamide resin shows particularly excellent heat resistance and mechanical properties.

[Chemical Formula 9]

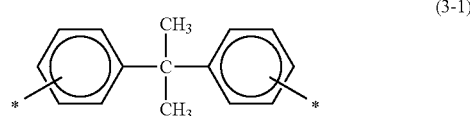

(3-1)

(3-2)

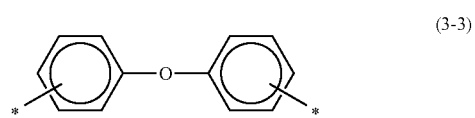

(3-3)

wherein * means connecting to the C=O group.

When Y of the polyamide resin represented by the above-mentioned formula (3) is a dicarboxylic acid for example, to increase reaction yield, there may be used an active ester-type dicarboxylic acid derivative which is obtained by preliminarily reacting the dicarboxylic acid with 1-hydroxy-1,2,3-benzotriazole, etc. When Y is a tetracarboxylic acid, to increase reaction yield, a corresponding anhydride can be used.

In the polyamide resin represented by the formula (1), O—$R_2$ of Z, which is a substituent of Z, and O—$R_2$ and COO—$R_2$ of Y, each of which is a substituent of Y, are each a group that is protected by an organic group having 1 to 15 carbon atoms for the purpose of controlling the solubility of the hydroxyl and carboxyl groups in alkaline aqueous solutions, and they may protect the hydroxyl and carboxyl groups as needed. Examples of $R_2$ include a formyl group, methyl group, ethyl group, propyl group, isopropyl group, t-butyl group, t-butoxycarbonyl group, phenyl group, benzyl group, tetrahydrofuranyl group and tetrahydropyranyl group.

In the polyamide resin represented by the formula (1), each of a and b represents the mol % of the repeating unit; a+b=100 mol %; a is 30 to 70 mol %; and b is 30 to 70 mol %. Preferably, a is 40~60 mol % and b is to 60 mol %. If out of the ranges, the polyamide resin may get an imbalance between its solubility in organic solvents used in EBR process and alkaline developers, transparency, heat resistance and reliability when cured at a low temperature.

When two or more kinds of organic groups Z or organic groups Y are contained, each of a and b represents the total mol % of the corresponding repeating unit.

In the polyamide resin represented by the formula (1), preferably, an amino group at a terminal end of the polyamide resin is capped with, to be an amide, an acid anhydride containing an aliphatic group or a cyclic compound group having at least one alkenyl or alkynyl group. As a result, it is able to increase the storage stability of the polyamide resin.

As such a group that is, from the viewpoint of increasing especially the storage stability, preferable as the group which is derived from the acid anhydride containing an aliphatic group or a cyclic compound group having at least one alkenyl or alkynyl group after being reacted with the amino group, there may be mentioned a group selected from the group consisting of the formula (4), that is, the formulae (4-1) to (4-3). The group which is derived from the acid anhydride containing an aliphatic group or a cyclic compound group having at least one alkenyl or alkynyl group after being reacted with the amino group, is not limited thereto. For example, there may be used a group selected from the group consisting of formulae (6) and (7) described in paragraphs

[0025] and [0026] of JP-A No. 2008-170498. They can be used alone or in combination of two or more kinds.

[Chemical Formula 10]

[Formula (4)]

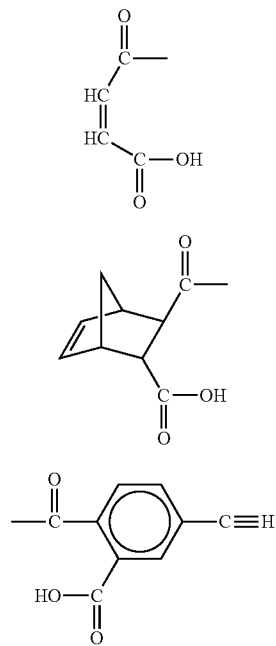

The capping method is not limited to the above method. Also, an acid at a terminal end of the polyamide resin can be capped with, to be an amide, an amine containing an aliphatic group or a cyclic compound group having alkenyl or alkynyl group.

The polyamide resin can have a nitrogen-containing cyclic compound at least one of a side chain of the polyamide resin and the other terminal end of the same. Because of this, there is an increase in the adhesion of the polyamide resin to metal wiring (especially copper wiring), etc. This is because when one terminal end of the polyamide resin has an organic group having an unsaturated group, the resin reacts, so that a cured film of the polyamide resin shows excellent mechanical properties such as excellent tensile elongation rate. Because, when the polyamide resin has a nitrogen-containing cyclic compound at least one of a side chain of the polyamide resin and the other terminal end of the same, the nitrogen-containing cyclic compound reacts with metal wiring of copper and copper alloy, so that the polyamide resin shows excellent adhesion.

Examples of the group having the nitrogen-containing cyclic compound include a 1-(5-1H-triazoyl)methylamino group, 3-(1H-pyrazoyl)amino group, 4-(1H-pyrazoyl)amino group, 5-(1H-pyrazoyl)amino group, 1-(3-1H-pyrazoyl)methylamino group, 1-(4-1H-pyrazoyl)methylamino group, 1-(5-1H-pyrazoyl)methylamino group, (1H-tetrazol-5-yl) amino group, 1-(1H-tetrazol-5-yl)methyl-amino group and 3-(1H-tetrazol-5-yl)benz-amino group. Among them, groups selected from the formula (5), that is, the formulae (5-1) and (5-2) are preferred. Thereby, especially, there is an increase in the adhesion of the polyamide resin to metal wiring of copper and copper alloys.

[Chemical Formula 11]

[Formula (5)]

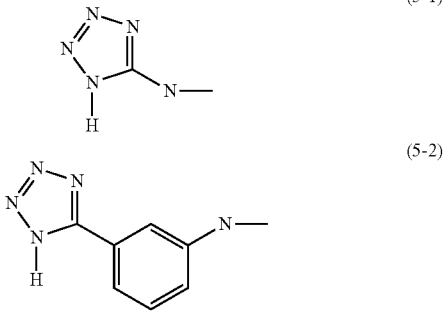

The number average molecular weight (Mn) of the polyamide resin represented by the formula (1) is preferably 5,000 to 40,000, particularly preferably 6,000 to 20,000. The number molecular average weight (Mn) can be measured with a molecular weight measuring apparatus using gel permeation chromatography (GPC) and calibrated using a standard polystyrene polymer.

Dehydration and ring-closure reaction occurs when the polyamide resin represented by the formula (1) is heated at about 200 to 400° C., thereby obtaining a heat resistant resin which is in the form of polybenzoxazole or in the form of a copolymer of polyimide and polybenzoxazole.

The polyamide resin is preferably such that a film formed by applying and drying the polyamide resin has a light transmittance of 20% or more at a wavelength of 365 nm when the film has a thickness of 5 μm. When the film has a high transmittance, large amounts of actinic radiation reaches deep into the film, thereby increasing the sensitivity. When the sensitivity is increased, the exposure time is shortened and there is an increase in productivity, therefore. More preferably, the light transmittance is 30% or more.

In recent years, integration of semiconductor devices is developed and it is needed to produce very fine and minute patterns. The polyamide resin is required to have a transmittance at shorter exposure wavelengths such as 365 nm (i-line). When the transmittance at 365 nm is less than the above range, the below-described diazoquinone compound which is used as a photosensitive agent, may not be changed into an alkali-soluble compound sufficiently, so that remains of the resin or scum may be produced upon development and no pattern may be obtained, therefore.

As the photosensitive agent used in the present invention, for example, there may be mentioned a photosensitive diazoquinone compound. Specific examples thereof include an ester of a phenolic compound with a 1,2-naphthoquinone-2-diazide-5-sulfonic acid or 1,2-naphthoquinone-2-diazide-4-sulfonic acid. For example, there may be used an ester compound selected from the group consisting of formulae (9) to (12) described in paragraphs [0031] to [0035] of JP-A No. 2008-170498. They may be used alone or in combination of two or more kinds.

Particularly preferred is an ester compound selected from the group consisting of the formula (6), that is, the formulae (6-1) to (6-9). The positive photosensitive resin composition comprising the ester compound selected from the group consisting of the formula (6), that is, the formulae (6-1) to (6-9), shows high sensitivity and high resolution; moreover, it is expected to produce little scum.

[Chemical Formula 12]
[Formula (6)]
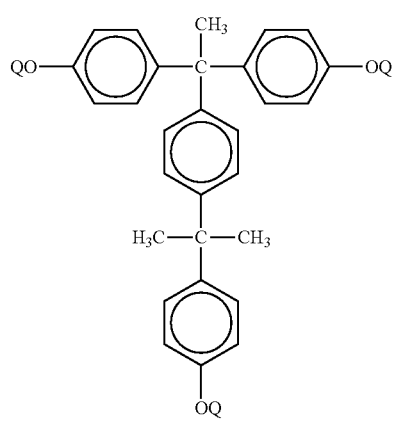
(6-1)
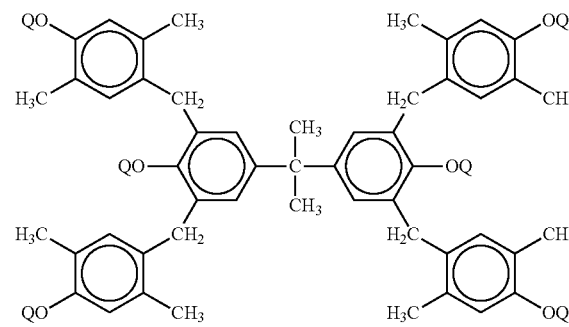
(6-2)
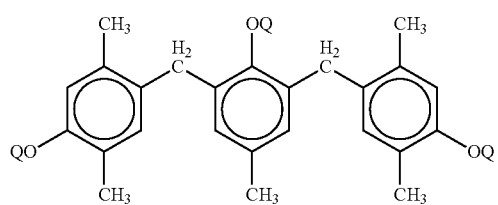
(6-3)
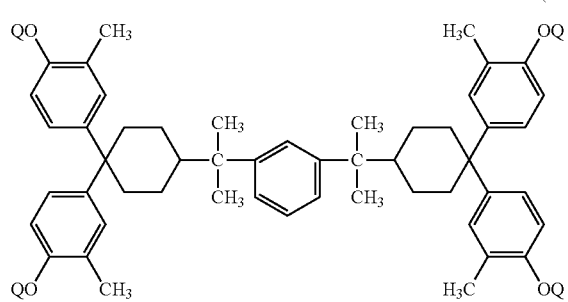
(6-4)
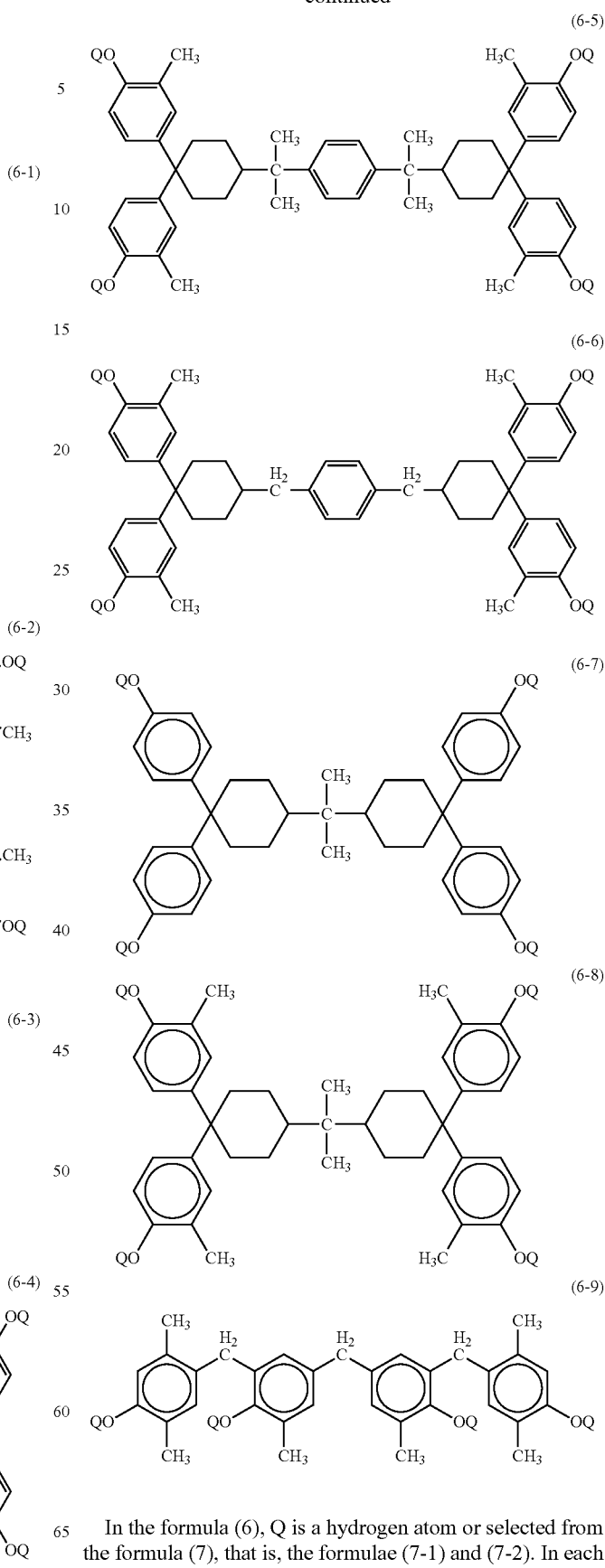
In the formula (6), Q is a hydrogen atom or selected from the formula (7), that is, the formulae (7-1) and (7-2). In each compound, at least one Q is the formula (7-1) or (7-2).

[Chemical Formula 13]

[ Formula (7)]

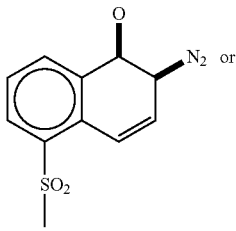
(7-1)

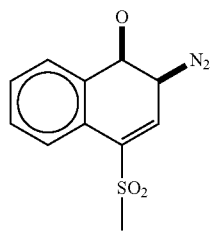
(7-2)

The added amount of the photosensitive agent used in the present invention is preferably 1 to 50 parts by weight, more preferably 10 to 40 parts by weight, with respect to the polyamide resin of 100 parts by weight. If the lower limit or more, there is an increase in the solubility of the exposed portion in alkaline solutions, so that excellent patterning properties are obtained, resulting in high resolution and improved sensitivity. If the upper limit or less, not only scum but also a decrease in the transparency of the film, which is due to the photosensitive agent itself, are appropriately suppressed, so that high sensitivity and high resolution are obtained.

Also in the present invention, a compound having a phenolic hydroxyl group can be used concurrently so as to realize patterning with high sensitivity and no scum. As the compound having a phenolic hydroxyl group, it is preferable to use a compound which has one to three (preferably two) benzene rings and two to five phenolic hydroxyl groups in a molecule thereof. Specific preferred structures thereof include the following formula (8), that is, the formulas (8-1) to (8-3). In addition, there may be mentioned those represented by formulae (14) to (20) described in paragraphs 0038 to 0044 of JP-A No. 2008-170498. The compound having a phenolic hydroxyl group of the present invention is not limited thereto, however.

[Chemical Formula 14]

[Formula (8)]

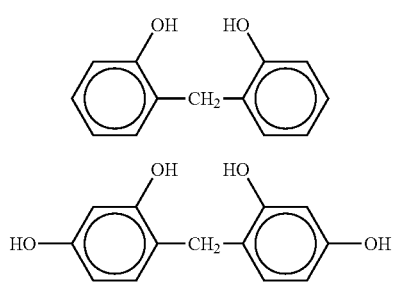
(8-1)

(8-2)

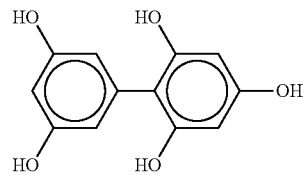
(8-3)

The added amount of the phenolic compound is preferably 1 to 30 parts by weight, more preferably 1 to 25 parts by weight, with respect to the polyamide resin of 100 parts by weight. If 1 part by weight or more, upon development, scum production is suppressed and the solubility of the exposed portion is promoted, resulting in an increase in the sensitivity. If the upper limit or less, there is no decrease in remaining thickness ratio and resolution, and no precipitation occurs during frozen storage, so that it is preferable.

As needed, the positive photosensitive resin composition of the present invention can contain additives such as an acrylic-type, silicone-containing, fluorine-containing or vinyl-type leveling agent and a silane coupling agent.

In the present invention, these components are dissolved in a solvent and used in the form of varnish. Examples of the solvent include N-methyl-2-pyrrolidone, γ-butyrolactone, N,N-dimethylacetamide, dimethylsulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate and methyl-3-methoxypropionate. They can be used alone or in combination of two or more kinds.

The positive photosensitive resin composition of the present invention is sufficiently soluble in organic solvents used in EBR process, such as propylene glycol monomethyl ether, propylene glycol monomethyl ether acetate, and a mixture thereof. In concrete terms, it is soluble in any of the above organic solvents at normal temperature (25° C.) in a concentration of 20% by weight. The positive photosensitive resin composition of the present invention has such a high solubility in organic solvents, so that EBR process can be smoothly implemented.

The method for using the positive photosensitive resin composition of the present invention is as follows. First, the composition is applied to an appropriate support such as a silicon wafer, ceramic substrate and aluminum substrate. The applied amount is, when applied onto a semiconductor device, such an amount that forms a film having a final thickness is 0.1 to 30 μm after curing. If the film thickness is less than the lower limit, it is difficult for the film to fully function as the protecting form of the semiconductor device. If more than the upper limit, not only it is difficult to obtain a fine processing pattern, but also it takes a long processing time, resulting in a low throughput. Examples of the method for applying the composition include spin coating using a spinner, spray coating using a spray coater, immersion, printing and roll coating. Next, the coated film is dried by pre-baking at 60 to 130° C. and then exposed to actinic radiation in a desired pattern. As the actinic radiation, X-rays, electron beams, ultraviolet radiation, visible radiation or the like can be used. Preferred is one having a wavelength of 200 to 500 nm.

Then, the exposed portion is dissolved and removed with a developer to obtain a pattern. As the developer, an aqueous solution of an alkali can be suitably used, examples of the alkali including inorganic alkalis such as sodium hydroxide, potassium hydroxide, sodium carbonate, sodium silicate, sodium metasilicate and ammonia water, primary amines such as ethylamine and n-propylamine, secondary amines such as diethylamine and di-n-propylamine, tertiary amines such as triethylamine and methyldiethylamine, alcohol amines such as dimethylethanolamine and triethanolamine, and quaternary ammonium salts such as tetramethyl ammonium hydroxide and tetraethyl ammonium hydroxide. Also, an aqueous solution produced by adding an appropriate amount of water-soluble organic solvent or surfactant to said aqueous solution can be suitably used as the developer, examples of the solvent including alcohols such as methanol and ethanol. As the development method, spraying, paddling, immersion, sonication, etc., can be used.

Next, the pattern formed by the development is rinsed. Distilled water is used as the rinsing solution. Next, a heat treatment is performed to form an oxazole ring, or an oxazole ring and an imide ring, thereby obtaining a final pattern with excellent heat resistance.

The heat treatment can be performed at a high or low temperature. When the treatment is performed at high temperature, the heat treatment temperature is preferably 280° C. to 380° C., more preferably 290° C. to 350° C. When performed at a low temperature, the heat treatment temperature is preferably 150° C. to 280° C., more preferably 180° C. to 260° C.

In the positive photosensitive resin composition of the present invention, the polyamide resin preferably shows a cyclization rate of 80% or more after it is cured by heating at 250° C. for 90 minutes, more preferably a cyclization rate of 90% or more. If the cyclization rate when cured at 250° C. for 90 minutes is less than the above range, it is possible that the polyamide resin shows high water absorption property and thus decreases the reliability of a semiconductor device, or it shows a low glass transition temperature and thus a decrease in heat resistance.

Herein, "cyclization rate" refers to a ratio of amide groups which caused a cyclization reaction after curing, with respect to the whole amino groups in the polyamide resin represented by the formula (1), which can cause a cyclization reaction due to dehydration and ring-closure, etc. It is able to obtain the cyclization rate in such a manner that the ratio of amide groups in the polyamide resin which can cause a cyclization reaction before curing (ratio (A)) and after curing (ratio (B)) are obtained by means of a Fourier transform infrared spectrophotometer, for example, and the cyclization rate is calculated using the formula: $(1-(B/A)) \times 100$.

(2) Cured Film, Protecting Film and Insulating Film

Next, the cured film formed with the positive photosensitive resin composition of the present invention will be described. The cured film of the present invention comprises a cured product of the positive photosensitive resin composition of the present invention and it is useful for forming a protecting film and an insulating film. The cured film of the present invention is useful for not only semiconductor devices such as a semiconductor element, but also for display devices such as a TFT liquid crystal display and an organic EL display. It is also useful as the interlayer insulation film of a multilayered circuit, the cover coat of a flexible copper-clad board, a solder resist film, or a liquid crystal alignment film.

Examples of the applications to semiconductor devices include the following: a passivation film which is the aforementioned cured film of the positive photosensitive resin composition that is formed on a semiconductor element to protect metal wiring from corrosion due to water entering from the outside of the semiconductor element or ionic impurities contained in the molding compound for encapsulation; a protecting film such as a buffer coating film, which is the aforementioned cured film of the positive-type photosensitive resin composition that is formed on a passivation film to protect metal wiring from physical damage due to a filler contained in the molding compound for encapsulation or to reduce the transformation of metal wiring by shear stress which is induced by the difference in coefficient of thermal expansion (CTE) between the molding compound for encapsulation and substrate; an insulating film such as an interlayer insulation film, which is the aforementioned cured film of the positive photosensitive resin composition that is formed on a circuit formed on a semiconductor element; an a-ray shielding film for preventing soft errors due to a-rays emitted from a minute amount of radioactive substance contained in the molding compound for encapsulation; a planarizing film; a projection (resin post) used for producing a wafer level chip size package (W-CSP); and a partition wall.

Examples of the applications to display devices include a protecting film which is the cured film of the positive photosensitive resin composition that is formed on a display element; an insulating film or planarizing film for TFT elements, color filters, etc.; a projection for MVA-type liquid crystal displays, etc.; and a partition wall for organic EL element cathodes, etc. The positive photosensitive resin composition is used in such a manner that in accordance with the use for a semiconductor device, a patterned layer of the positive photosensitive resin composition is formed on a substrate on which a display element or color filter is formed. High transparency is required particularly for an insulating film or planarizing film of display devices. The positive photosensitive resin composition is able to form a resin layer with excellent transparency by employing a post-exposure step before curing the layer of the positive photosensitive resin composition, so that it is practically more preferable.

EXAMPLES

The present invention will be described in detail by way of Examples and Comparative Examples. The scope of the present invention is not limited to the examples, however.

Example 1

Synthesis of Polyamide Resin

A dicarboxylic acid derivative (active ester) of 410.04 g (0.900 mol), 4,4'-ethylidenebis(2-aminophenol) of 97.68 g (0.400 mol) and 4,4'-ethylidenebis(2-amino-3,6-dimethylphenol) of 180.24 g (0.600 mol) were put in a four-neck separable flask equipped with a thermometer, stirrer, raw material inlet and dry nitrogen gas feed pipe, the dicarboxylic acid derivative being obtained by the reaction of isophthalic acid of 0.360 mol, diphenyl ether-4,4'-dicarboxylic acid of 0.540 mol with 1-hydroxy-1,2,3-benzotriazole of 1.800 mol. N-methyl-2-pyrrolidone of 3,440 g was added to dissolve them. The mixture was reacted at 80° C. for 16 hours with an oil bath. Next, 43.04 g (0.250 mol) of 4-ethynylphthalic anhydride dissolved in 215 g of N-methyl-2-pyrrolidone was added thereto and the mixture was stirred for 3 hours to complete the reaction. After filtering the reaction mixture, the reaction mixture was poured into a mixed solution of water and isopropanol at 7:4 (volume ratio). The resulting precipitate was collected by filtration, washed sufficiently with water, and dried under vacuum to obtain the target polyamide resin which is represented by the formula (1) wherein a=40, b=60, m=2 and n=0, which has a number average molecular weight of 10,127 and which comprises the compounds shown in Table 1.

Evaluation of Transmittance

A resin obtained by dissolving the polyamide resin of 3.0 g in N-methyl-2-pyrrolidone of 8.0 g, was applied on a quartz plate with a spin coater and then dried with a hot plate at 120° C. for four minutes, thereby obtaining a coating film having a thickness of 5 μm. The transmittance of the coating film was measured by an ultraviolet-visible spectrophotometer (manufactured by Shimadzu Corporation). The transmittance at a wavelength of 365 nm was 31%.

Evaluation of Solubility in EBR Solvent (OK73Thinner)

The polyamide resin of 0.5 g was added to OK73 thinner (manufactured by Tokyo Ohka Kogyo Co., Ltd.) of 2.0 g and stirred. The thinner is a mixed solvent of propylene glycol monomethyl ether and propylene glycol methyl ether acetate and is used generally in EBR process. The polyamide resin was dissolved in OK 73 thinner within 15 minutes. In Table 1, as to the solubility evaluation in OK73 thinner, "o" is shown when dissolved in OK73 thinner within 15 minutes as with this, while "x" is shown when not dissolved in OK73 thinner within 15 minutes.

Synthesis of Photosensitive Diazoquinone Compound

A phenol compound represented by the following formula (B-1) of 12.74 g (0.030 mol) and triethylamine of 7.59 g (0.075 mol) were put in a four-neck separable flask equipped with a thermometer, stirrer, raw material inlet and dry nitrogen gas feed pipe. Acetone of 103 g was added to dissolve them. After cooling the reaction solution to 10° C. or less, 1,2-naphthoquinone-2-diazide-5-sulfonyl chloride of 20.15 g (0.075 mol) and acetone of 100 g were gradually added dropwise, keeping the temperature at less than 10° C. The mixture was stirred for five minutes at 10° C. or less and then for five hours at room temperature to complete the reaction. After filtering the reaction mixture, the reaction mixture was poured into a solution of water and methanol at 3:1 (volume ratio). The resulting precipitate was collected by filtration, washed sufficiently with water and dried under vacuum to obtain a photosensitive diazoquinone compound represented by the following formula (Q-1),

[Chemical Formula 15]

B-1:

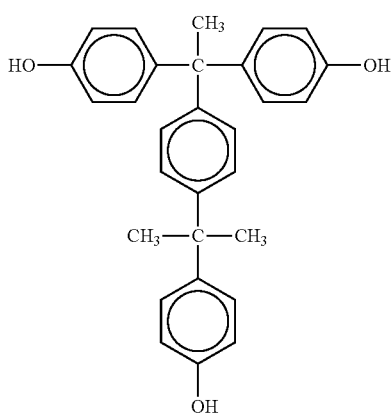

Q-1:

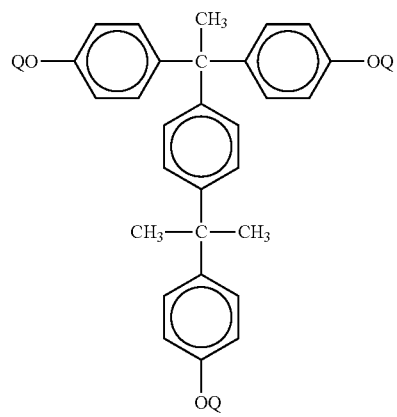

wherein Q is a hydrogen atom or

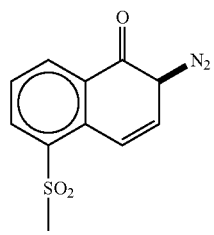

and 83% of the whole Qs is

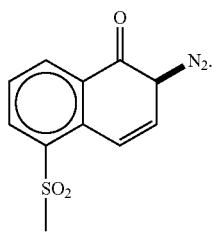

Production of Photosensitive Resin Composition

The thus-synthesized polyamide resin of 100 g, the photosensitive agent represented by the formula (Q-1) of 13.5 g, and 2,2'-methylenebisphenol of 10 g were dissolved in γ-butyrolactone of 200 g. Then, the mixture was filtered with a Teflon (trademark) filter having a pour diameter of 0.2 μm to obtain a photosensitive resin composition.

Evaluation of Cyclization Rate

The positive photosensitive resin composition was applied onto two silicon wafers with a spin coater and then pre-baked with a hot plate at 120° C. for four minutes, thereby obtaining two coating films having a thickness of about 1 μm. Then, one of the silicon wafers each of which having the coating film formed thereon, was immersed in 2% hydrofluoric acid to obtain a film. This film was measured with a Fourier transform infrared spectrophotometer PARAGON 1000(manufactured by PerkinElmer, Inc.) to calculate the ratio between the peak of amide groups at 1,650 $cm^{-1}$ and that of wholly aromatic groups at 1,490 $cm^{-1}$ (peak ratio (A)). Next, the other silicon wafer having the coating film formed thereon, was heated with an oven at 250° C. for 90 minutes. Then, a cured film was obtained in the same manner as above and measured with the Fourier transform infrared spectrophotometer to calculate the ratio between the peak of amide groups at 1,650 cm$^{-1}$ and that of wholly aromatic groups at 1,490 cm$^{-1}$ (peak ratio (B)). The cyclization rate is a value that was obtained by multiplying (1-(B/A)) by 100. The cyclization rate obtained in this manner was 93%.

Evaluation of EBR property and Evaluation of Processability

The positive photosensitive resin composition was applied onto a silicon wafer with a spin coater. Then, OK73 thinner (manufactured by Tokyo Ohka Kogyo Co., Ltd.) was sprayed on the edge and rear surface of the wafer for 90 seconds through a nozzle. The wafer was pre-baked with a hot plate at 120° C. for four minutes, thereby obtaining a coating film having a thickness of about 7.2 μm. Unnecessary positive photosensitive resin composition was completely removed from the edge and rear surface of the wafer, so that the wafer was confirmed to be able to undergo EBR process with OK73 thinner. In Table 1, as to the EBR evaluation, "0" is shown when EBR process was conducted as with this, while is shown when unnecessary positive photosensitive resin composition remained on the edge and/or rear surface of the wafer.

Using an i-line stepper (4425i manufactured by NIKON Corporation), the coating film was exposed through a mask manufactured by Toppan Printing Co., Ltd. (Test Chart No. 1, a mask on which line pattern and space pattern having a width of 0.88 to 50 μm are drawn) with changing the exposure amount. Next, puddle development was performed thereon with a 2.38% tetramethylammonium hydroxide aqueous solution, controlling the developing time so that the difference in film thickness between the coating film after the prebaking and the unexposed portion of the coating film after the development is 1 μm. Then, the coating film was rinsed with pure water for 10 seconds. As a result, a pattern was found to be formed. In Table 1, as to the processability evaluation, "o" is shown when a pattern was found to be formed as with this.

Evaluation of Water Absorption Property

The positive photosensitive resin composition was applied onto a 6-inch silicon wafer with a spin coater and then pre-baked with a hot plate at 120° C. for four minutes, thereby obtaining a coating film having a thickness of about 10 μm. Next, the silicon wafer having the coating film formed thereon, was heated with an oven at 250° C. for 90 minutes. A 5-cm-square cut was made in the cured coating film with a cutter knife. Then, the film was immersed in 2% hydrofluoric acid to obtain a 5-cm-square film. The water absorption property of this film was measured in accordance with testing standard JIS-K7209, thereby obtaining a value of 1.22%.

Evaluation of Glass Transition Temperature (Tg)

The photosensitive resin composition was applied onto a 6-inch silicon wafer with a spin coater and then pre-baked with a hot plate at 120° C. for four minutes, thereby obtaining a coating film having a thickness of about 10 μm. Next, the silicon wafer having the coating film formed thereon, was heated with an oven at 250° C. for 90 minutes. Then, the thus-obtained cured film was immersed in 2% fluoric acid to remove the film from the silicon wafer. The obtained film was washed sufficiently with pure water and dried with an oven. The dried film was cut to make a 5-mm-wide sample piece. As a result of measuring the glass transition temperature of the sample piece with a thermomechanical analyzer (TMA) (SS6000 manufactured by Seiko Instruments, Inc.), it was 274° C.

Examples 2, 3 and 4, and Comparative Examples 1 and 2

Polyamide resins were synthesized in the same manner as Example 1, except that the material amount of the active esterified-carboxylic acid and that of the amine were changed appropriately according to the formulation of Examples and Comparative Examples shown in Table 1. The number average molecular weight of the thus-obtained polyamide resins are as follows: 9,627 in Example 2, 8,837 in Example 3, 8,310 in Example 4, 10,663 in Comparative Example 1 and 9,497 in Comparative Example 2. In each of Examples and Comparative Examples, a positive photosensitive resin composition was produced and evaluated in the same manner as Example 1. Table 1 shows the structure of B-1 and Q-1 of each of Examples and Comparative Examples.

TABLE 1

| | Formulation Polyamide Resin (A) (100 g) | | | | Photosensitive Diazoquinone Compound (B) | Properties Transmittance |
|---|---|---|---|---|---|---|
| | Amine (Molar Ratio) | | Acid (Molar Ratio) | | (g) | (%) |
| Example 1 | 4,4'-Ethylidenebis(2-aminophenol) | (0.40) | Isophthalic acid | (0.36) | Q-1 (15) | 31 |
| | 4,4'-Ethylidenebis(2-amino-3,6-dimethylphenol) | (0.60) | Diphenyl ether-4,4'-dicarboxylic acid | (0.54) | | |
| Example 2 | 4,4'-Ethylidenebis(2-aminophenol) | (0.70) | Isophthalic acid | (0.36) | Q-1 (15) | 20 |
| | 4,4'-Methylenebis(2-amino-3,6-dimethylphenol) | (0.30) | Diphenyl ether-4,4'-dicarboxylic acid | (0.54) | | |
| Example 3 | 4,4'-Ethylidenebis(2-aminophenol) | (0.50) | Isophthalic acid | (0.36) | Q-1 (15) | 29 |
| | 4,4'-Ethylidenebis(2-amino-3,6-dimethylphenol) | (0.50) | Diphenyl ether-4,4'-dicarboxylic acid | (0.54) | | |
| Example 4 | 4,4'-Ethylidenebis(2-aminophenol) | (0.30) | Isophthalic acid | (0.21) | Q-1 (15) | 16 |
| | 4,4'-Methylenebis(2-aminophenol) | (0.70) | Diphenyl ether-4,4'-dicarboxylic acid | (0.63) | | |
| Comparative Example 1 | Hexafluoro-2,2'-bis(3-amino-4-hydroxyphenyl)propane | (1.00) | Isophthalic acid | (0.18) | Q-1 (15) | 96 |
| | | | Diphenyl ether-4,4'-dicarboxylic acid | (0.72) | | |
| Comparative Example 2 | 4,4'-Methylenebis(2-aminophenol) | (1.00) | Isophthalic acid | (0.18) | Q-1 (15) | 16 |
| | | | Diphenyl ether-4,4'-dicarboxylic acid | (0.72) | | |

TABLE 1-continued

| | Properties | | | | | | |
|---|---|---|---|---|---|---|---|
| | Solubility in OK73 Thinner | Cyclization Rate (%) | EBR Property | Processability | Water Absorption Property | Tg (° C.) | Overall Evaluation |
| Example 1 | ○ | 93 | ○ | ○ | 1.22 | 274 | ○ |
| Example 2 | ○ | 82 | ○ | ○ | 1.25 | 270 | ○ |
| Example 3 | ○ | 85 | ○ | ○ | 0.96 | 264 | ○ |
| Example 4 | ○ | 80 | ○ | ○ | 1.5 | 265 | ○ |
| Comparative Example 1 | ○ | 68 | ○ | ○ | 1.36 | 279 | X |
| Comparative Example 2 | X | 83 | X | ○ | 1.77 | 267 | X |

As shown in Table 1, Examples 1 to 5 had excellent transmittance and cyclization rate, and they were dissolved in a general, widely-used EBR solution. As a result, they achieved the required processability, heat resistance and reliability when cured at a low temperature, and EBR property.

In Comparative Example 1 using the polyamide resin which was synthesized by using hexafluoro-2,2'-bis(3-amino-4-hydroxyphenyl)propane as the amine component, a significantly low cyclization rate and inferior curing property were obtained; therefore, it was found to have poor resistance to water absorption and thus poor reliability. In Comparative Example 2 using the polyamide resin which was synthesized by using 4,4'-methylenebis(2-aminophenol) as the amine component, no solubility in OK73 thinner was exhibited, so that EBR process could not be conducted; moreover, poor resistance to water absorption was exhibited.

Industrial Applicability

According to the present invention, a positive photosensitive resin composition which has high sensitivity and which is highly heat resistant and reliable even when it is cured at a low temperature, is provided.

According to the present invention, a cured film which has high sensitivity and which is highly heat resistant and reliable even when it is cured at a low temperature, a protecting film, an insulating film and semiconductor and display devices using the same, are provided.

The invention claimed is:

1. A positive-working photosensitive resin composition comprising a polyamide resin and a photosensitive agent, wherein the polyamide resin is represented by the formula (1)

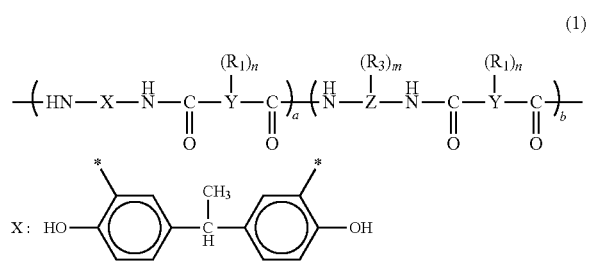

wherein Y is an organic group; Z is an organic group; $R_1$ is a hydroxyl group, carboxyl group, O—$R_2$ or COO—$R_2$; n is an integer of 0 to 4 and when n is an integer of 2 or more, two or more $R_1$s may be the same or different; $R_2$ is an organic group having 1 to 15 carbon atoms; $R_3$ is a hydroxyl group or O—$R_2$; m is an integer of 0 to 2 and when m is 2, two $R_3$s may be the same or different; a is 30 to 70 mol%; b is 30 to 70 mol%; a+b=100 mol%; when $R_3$ is a hydroxyl group, it is attached to an ortho position of the amide group, and when $R_3$ is not a hydroxyl group, at least one $R_1$ is a carboxyl group; and * means connecting to the NH group.

2. The positive-working photosensitive resin composition according to claim 1, wherein Z of the polyamide resin is represented by the formula (2-1):

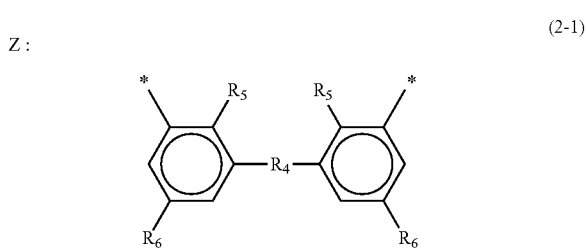

wherein * means connecting to the NH group; $R_4$ is an organic group; $R_5$ is a hydrogen atom, alkyl group, alkoxy group, acyloxy group or cycloalkyl group and $R_5$s may be the same or different; $R_6$ is a hydrogen atom, alkyl group, alkoxy group, acyloxy group or cycloalkyl group and $R_6$s may be the same or different; and $R_3$ is omitted herein.

3. The positive-working photosensitive resin composition according to claim 1, wherein Z of the polyamide resin is represented by the formula (2-2):

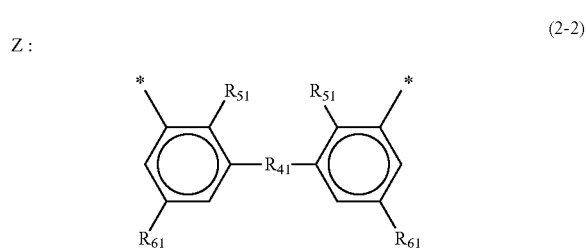

wherein * means connecting to the NH group; $R_{41}$ is an organic group; $R_{51}$ is an alkyl group, alkoxy group, acyloxy group or cycloalkyl group and $R_{51}$s may be the same or different; $R_{61}$ is an alkyl group, alkoxy group, acyloxy group or cycloalkyl group and $R_{61}$s may be the same or different; and $R_3$ is omitted herein.

4. The positive-working photosensitive resin composition according to claim 1, wherein Y of the polyamide resin is selected from the group consisting of the formulae (3-1) to (3-3):

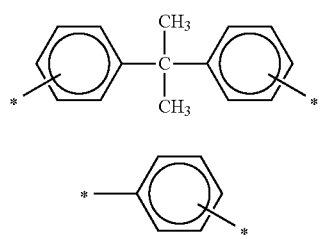

(3-1)

(3-2)

(3-3)

wherein * means connecting to the C=O group.

5. The positive-working photosensitive resin composition according to claim 1, wherein the polyamide resin has a transmittance of 20% or more at a wavelength of 365 nm.

6. The positive-working photosensitive resin composition according to claim 1, wherein the polyamide resin shows a cyclization rate of 80% or more after it is cured by heating at 250° C. for 90 minutes.

7. The positive-working photosensitive resin composition according to claim 1 wherein the photosensitive agent is one or more kinds of photosensitive diazoquinone compounds having a structure selected from the group consisting of the formulae (6-1) to (6-9):

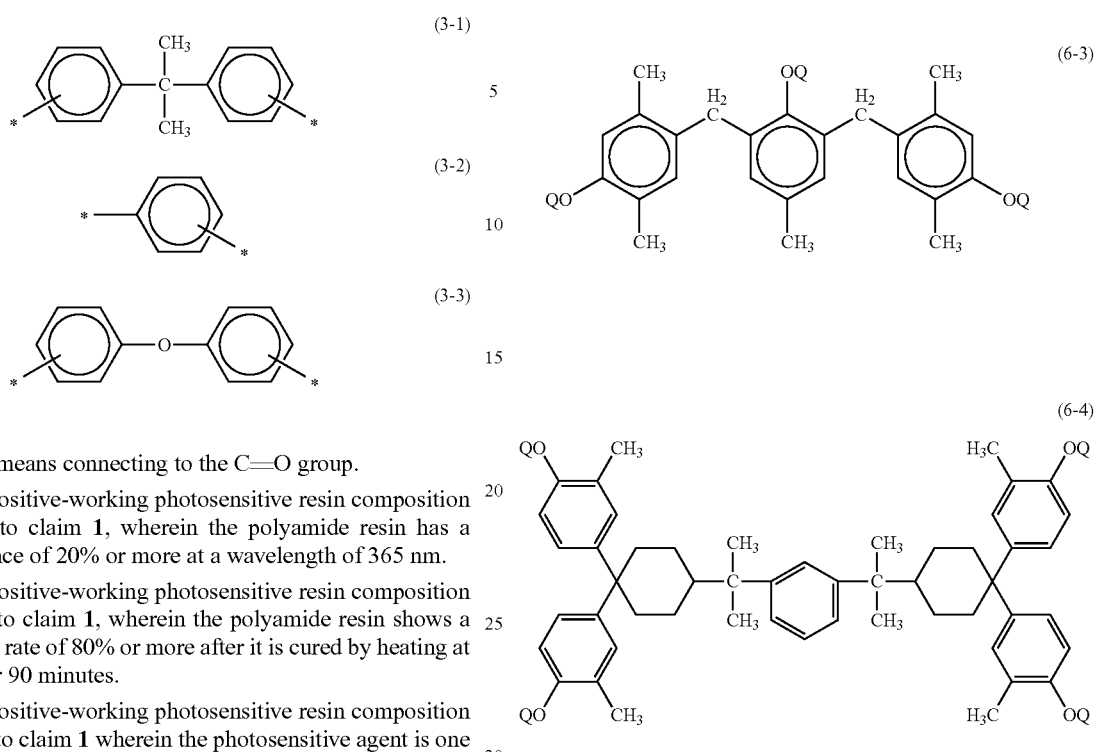

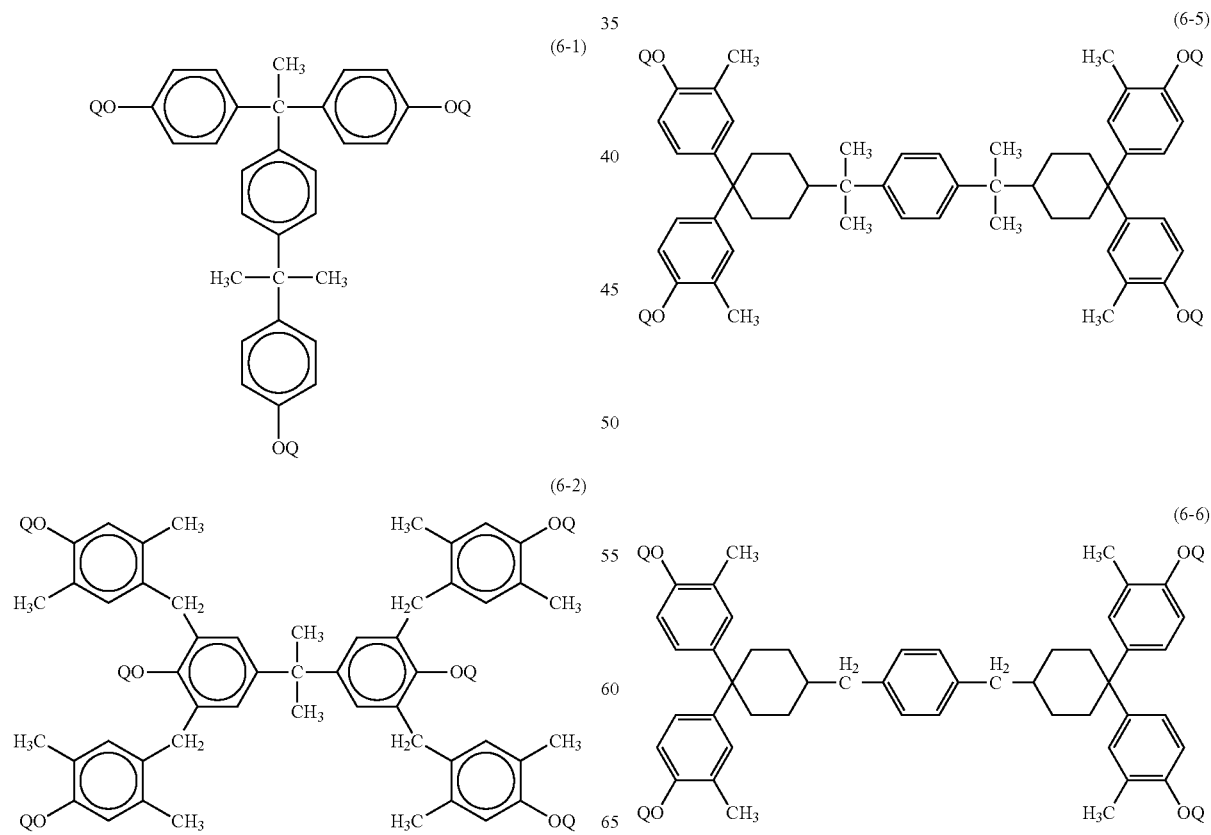

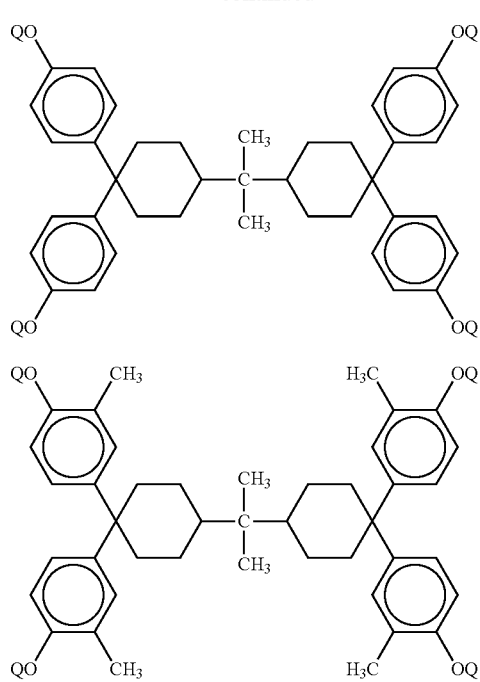

(6-7)

(6-8)

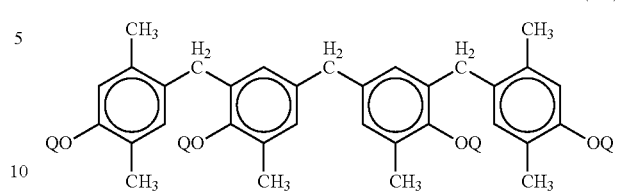

(6-9)

8. A cured film comprising a cured product of the positive-working photosensitive resin composition defined by claim 1.

9. A protecting film comprising the cured film defined by claim 8.

10. An insulating film comprising the cured film defined by claim 8.

11. A semiconductor device comprising the cured film defined by claim 8.

12. A display device comprising the cured film defined by claim 8.

* * * * *